(12) United States Patent
Morii

(10) Patent No.: US 6,617,052 B2
(45) Date of Patent: Sep. 9, 2003

(54) ORGANIC EL ELEMENT AND METHOD OF MANUFACTURING THE SAME

(75) Inventor: Katsuyuki Morii, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/811,618

(22) Filed: Mar. 20, 2001

(65) Prior Publication Data

US 2001/0044035 A1 Nov. 22, 2001

(30) Foreign Application Priority Data

Mar. 21, 2000 (JP) .......................... 2000-078662
Nov. 27, 2000 (JP) .......................... 2000-359882

(51) Int. Cl.$^7$ .......................... H05B 33/04; H05B 33/10
(52) U.S. Cl. .................. 428/690; 428/413; 428/917; 313/502; 313/512; 257/100; 427/66
(58) Field of Search ................. 428/413, 690, 428/917; 313/502, 512; 257/100; 427/66

(56) References Cited

U.S. PATENT DOCUMENTS

| 5,189,405 | A | * | 2/1993 | Yamashita et al. | .......... 340/781 |
| 5,652,067 | A | * | 7/1997 | Ito et al. | .......... 428/690 |
| 5,920,080 | A | * | 7/1999 | Jones | .......... 257/40 |
| 5,962,962 | A | * | 10/1999 | Fujita et al. | .......... 313/412 |
| 6,081,071 | A | * | 6/2000 | Rogers | |
| 6,143,434 | A | * | 11/2000 | Okada | .......... 428/690 |
| 6,198,220 | B1 | * | 3/2001 | Jones et al. | .......... 313/512 |

FOREIGN PATENT DOCUMENTS

| JP | A-5-182759 | 7/1993 |
| JP | A-7-282975 | 10/1995 |
| JP | 10-294182 | 11/1998 |
| JP | A-10-294182 | 11/1998 |
| JP | 11-312585 | 11/1999 |

OTHER PUBLICATIONS

Gu, G. et al., "Transparent organic light emitting devices", *Appl. Phys. Lett.*, 68 (19), May 6, 1996, pp. 2606–2608.

* cited by examiner

Primary Examiner—Cynthia H. Kelly
Assistant Examiner—Dawn Garrett
(74) Attorney, Agent, or Firm—Oliff & Berridge, PLC

(57) ABSTRACT

To seal an organic EL element satisfactorily, even when light is radiated from both electrode sides in the organic EL element. Laminate 20 is formed on transparent substrate 1. Laminate 20 includes transparent electrode 2, hole injecting and transporting layer 3, light emitting layer 4, and cathode 5. The top face of cathode 5 of laminate 20 and the end face of laminate 20 are covered by fist sealing layer 6 comprising LiF. The outer side of first sealing layer 6 is covered by second sealing layer 7 comprising an epoxy resin.

11 Claims, 1 Drawing Sheet

[FIG. 1]
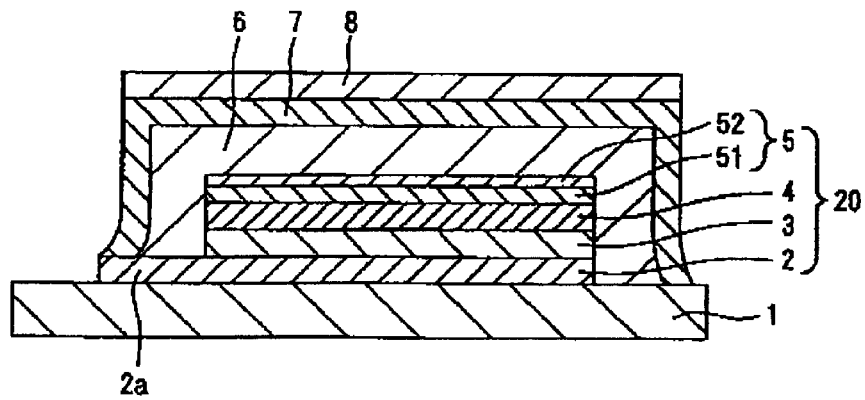
[FIG. 2]
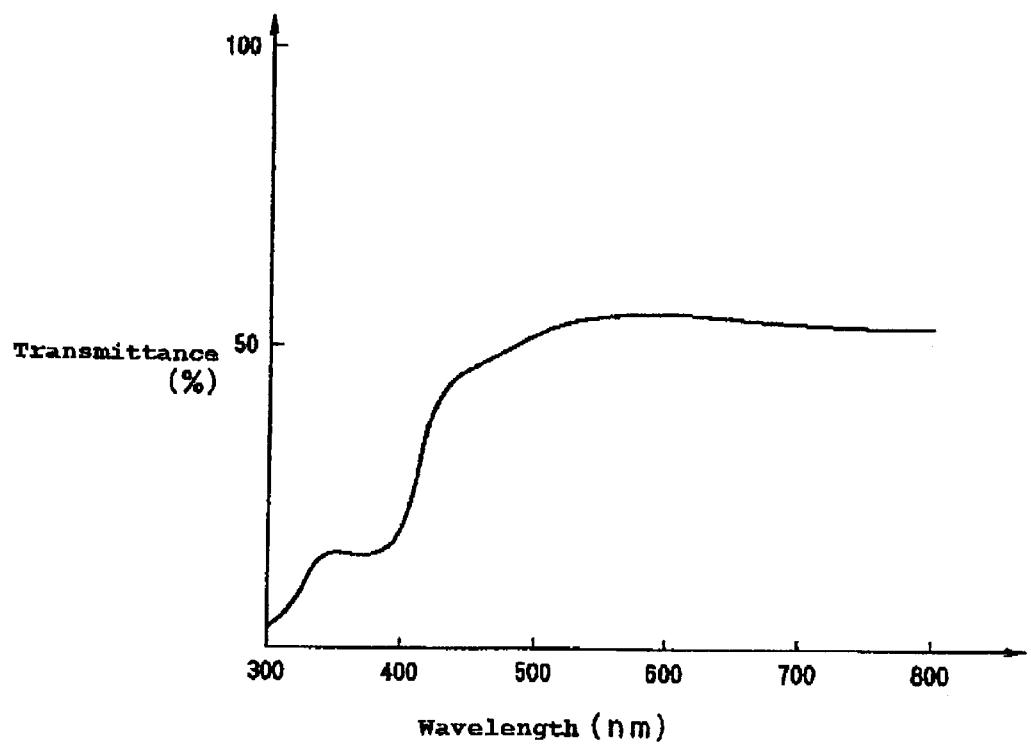

ORGANIC EL ELEMENT AND METHOD OF MANUFACTURING THE SAME

BACKGROUND OF THE INVENTION

1. Field of Invention

The present invention relates to an organic EL (electroluminescent) element which is used in, for example, a display or surface light source device, and to a method of manufacturing the same.

2. Description of Related Art

In recent years, development of an organic EL element (a luminous element having a structure including an anode and a cathode, and a light emitting layer including organic matter sandwiched between the anode and the cathode) has become an increasingly popular way of providing an auto-luminescent type display as an alternative of a liquid crystal display. A conventional structure of the organic EL element includes a structure in which an anode including a transparent electrode, a hole injecting and transporting layer, a light emitting layer, and a cathode which does not transmit light, formed in this order on a transparent substrate. In an organic EL element having this structure, light generated by the combination of an electron and a hole in the light emitting layer is radiated toward the substrate side.

Such an organic EL element has a feature in that high luminance light is highly efficiently emitted by only applying a low voltage. However, the organic EL element has a problem in that this excellent characteristic cannot be obtained when constitutive members of the element deteriorate due to change over time. Causes of this problem particularly include oxidation of the cathode and light emitting layer due to oxygen or water in the air.

Japanese Unexamined Patent Application Publication No. 5-182759 and Japanese Unexamined Patent Application Publication No. 7-282975 attempt to solve this problem by providing the sealing of a laminate with a sealant of a two-layer structure including an inner first sealing layer and an outer second sealing layer, which laminate is formed on a substrate and includes at least an anode, a light emitting layer, and a cathode. These publications mention that a $SiO_2$ film or SiO film is formed as the first sealing layer by a sputtering process or vapor deposition process, and a moisture proof photo-curable resinous layer or thermoplastic polymer layer is formed as the second sealing layer. On the other hand, when the cathode transmits light as well as the anode, light generated by the combination of an electron and a hole in the light emitting layer is also radiated toward the cathode side. Page 2606 of "Appl. Phys. Lett. Vol. 68(19), May 6, 1996" describes an organic EL element, in which a thin film which is obtained by vapor co-deposition of Mg and Ag is formed as the cathode and light is therefore also radiated toward the cathode side. In this organic EL element, quinolinolatoaluminum complex (Alq3), an organic material having a low molecular weight, is used as the light emitting layer. Additionally, an ITO film is formed on the cathode including Mg and Ag by a sputtering process. This ITO film is provided as a sealing layer and auxiliary electrode.

Additionally, this publication discloses that the sealing method of the cathode side has a significant influence on initial characteristics. Specifically, the publication mentions that the threshold voltage of the organic EL element is increased, resulting from the formation conditions (e.g., amount of oxygen) of the sealing layer.

However, when a $SiO_2$ film or SiO film is formed as a first sealing layer in the sealing operation with a sealant having a two-layer structure, there is a possibility of oxidation of the cathode which comes in contact with the first sealing layer. Even in the organic EL element in which light is radiated toward both electrode sides, a material having a low work function such as calcium is preferably used as the cathode. In this case, oxidation of the cathode is particularly liable to occur when a $SiO_2$ film or SiO film is formed as the first sealing layer.

SUMMARY OF THE INVENTION

The present invention solves these problems of the conventional technologies, by satisfactorily sealing an organic EL element even when light is radiated toward both electrode sides in the organic EL element.

To solve the above problem, the present invention provides an organic EL element which includes a substrate and a laminate formed on the substrate, the laminate having a structure including a cathode, an anode, and a light emitting layer, the light emitting layer including an organic material and being sandwiched between the cathode and anode, and at least the surface of the laminate on the opposite side to the substrate side being sealed by a sealant having a two-layer structure including an inner first sealing layer and an outer second sealing layer. In the organic EL element, the first sealing layer includes a halide of an alkali metal or alkaline earth metal, and the second sealing layer includes a moisture-proof resinous material.

In this organic EL element, the first sealing layer includes a halide of an alkali metal or alkaline earth metal, and at least the surface of the laminate on the opposite side to the substrate side becomes resistant to oxidation.

The halide of alkali metal or alkaline earth metal constituting the first sealing layer includes, for example, lithium fluoride (LiF), calcium fluoride ($CaF_2$), sodium fluoride (NaF), sodium chloride (NaCl), potassium chloride (KCl), potassium bromide (KBr), magnesium fluoride ($MgF_2$), and lithium chloride (LiCl). Among these, lithium fluoride (LiF) is particularly preferred.

In particular, even when an electrode arranged in the laminate on the opposite side to the substrate side is formed by a metallic material, which has a low work function and is very liable to be oxidized (e.g., a material containing calcium), oxidation of the electrode can be effectively inhibited by forming the first sealing layer to be in contact with this electrode as a layer including a halide of an alkali metal or alkaline earth metal (particularly LiF).

Additionally, a layer including LiF can have a transparency in visible light region higher than that of glass, by forming the layer to an appropriate thickness. Accordingly, this layer is suitable as a first sealant for use in the organic EL element in which light is radiated toward both electrode sides.

Materials for the second sealing layer include, for example, an acrylic resin and an epoxy resin. Among these, the epoxy resin is particularly preferred since it is highly resistant to moisture and has a high transmittance of visible light. Such a second sealing layer including an epoxy resin can be easily formed by, for example, applying a liquid thermosetting epoxy resin or light-curable epoxy resin and curing the applied resin.

In order to inhibit deterioration of the laminate (particularly of the light emitting layer) in the formation of the second sealing layer, as well as to obtain the sufficient inhibitory effect of the oxidation of electrode, the first sealing layer should preferably have a thickness of not less than 300 angstroms. Furthermore, the first sealing layer should preferably have a thickness of not more than 500 angstroms, from the viewpoint of inhibiting deterioration of the light emitting layer or the like due to heat in the film-formation of the first sealing layer.

Furthermore, in the organic EL element of the invention, it is preferred that the face on the opposite side to the substrate side and the end face of the laminate are sealed by a sealant having a two-layer structure, which two-layer structure includes a first sealing layer including a halide of an alkali metal or alkaline earth metal, and a second sealing layer including a moisture proof resinous material.

The present invention provides, in another aspect, a method of manufacturing an organic EL element, which includes the steps of forming a laminate on a substrate, said laminate having a structure including a cathode, an anode, and a light emitting layer, said light emitting layer including an organic material and being sandwiched between the cathode and anode; forming a first sealing layer at least on the surface of the formed laminate on the opposite side to the substrate side in an atmosphere substantially free from oxygen and water, said first sealing layer including a halide of an alkali metal or alkaline earth metal; and forming a second sealing layer on the outer side of the first sealing layer in an atmosphere substantially free from oxygen and water, said second sealing layer including a moisture proof resinous material.

In the method of the invention, a layer including LiF is preferably formed as the first sealing layer. In the invented method, a layer includes an epoxy resin is preferably formed as the second sealing layer.

When the first sealing layer including LiF is formed by vacuum deposition process, the formation is preferably performed in the condition that a film-forming rate is 8 angstroms or more per 1 second, from the viewpoint of inhibiting deterioration of the light emitting layer or the like due to heat in the film-formation of the first sealing layer.

In the method of the invention, the first sealing layer is preferably formed to a thickness of not less than 300 angstroms.

It is preferable in the method of the invention to form the first sealing layer including a halide of an alkali metal or alkaline earth metal and to form the second sealing layer including a moisture proof resinous material on the end face of the laminate, as well as the face of the laminate on the opposite side to the substrate side.

BRIEF DESCRIPTION OF THE DRAWINGS

FIG. 1 is a sectional view showing an organic EL element in accordance with an embodiment of the present invention;

FIG. 2 is a graph showing the transmittance in the visual light region of an organic EL element prepared according to the method of Example 1.

DETAILED DESCRIPTION OF PREFERRED EMBODIMENTS

The embodiments of the present invention will now be illustrated in detail with reference to the drawings.

FIG. 1 is a sectional view showing the structure to an organic EL element in accordance with an embodiment of the present invention.

In this organic EL element, laminate 20, including electrode (anode) 2 (for example, transparent electrode), hole injecting and transporting layer 3, light emitting layer 4 and cathode 5, is formed on substrate 1 (for example, transparent glass substrate). Cathode 5 has a two-layer structure including first cathode layer 51 comprising, for example, a Ca thin film, and second cathode layer 52 including an Al thin film. Of individual layers constituting laminate 20, anode 2 is planar and its terminal part 2a extends off the other layers, and the other layers are formed such that their planar portions are of the same size and in the same location.

First sealing layer 6 including LiF is formed over the entire top face (the surface on the opposite side to the substrate side) of cathode 5 of this laminate 20, over the entire end face of laminate 20 other than terminal part 2a, and over a portion of the top face of terminal part 2a. Second sealing layer 7, including a moisture proof epoxy resin, is formed over the entire outer side of the first sealing layer 6. Additionally, glass plate 8 that provides sealing is fixed on the top face of second sealing layer 7.

In this organic EL element, cathode 5 is formed of a two-layer structure, including, for example, a Ca layer, which is markedly liable to be oxidized, formed as an electrode arranged in the laminate on the opposite side to the substrate side. Oxidation of cathode 5 is effectively inhibited by providing first sealing layer 6 including LiF so as to cover this cathode 5.

Additionally, first sealing layer 6 including LiF becomes resistant to crack formation by providing second sealing layer 7 including an epoxy resin on the outer side of first sealing layer 6.

The first sealing layer 6, including LiF, is arranged so as to cover cathode 5 and thereby inhibit the contamination of an organic solvent, oxygen, or water contained in a liquid epoxy resin into light emitting layer 4 in the formation of second sealing layer 7. Consequently, the deterioration of light emitting layer 4 with time is reduced.

In this connection, an organic EL element, in which light is radiated outwardly, at least through the cathode 5, preferably from both the anode 2 side and the cathode 5 side, can be obtained by configuring cathode 5 as a two-layer structure in which first cathode layer (a cathode layer on the light emitting layer 4 side) 51 includes a material having a low work function and second cathode layer 52 has a work function higher than the aforementioned layer, and by setting the total thickness to 100 angstroms or less, as in this embodiment. It is preferable to use Ca or Mg as a material for first cathode layer 51 and to use aluminium (Al), silver (Ag), or gold (Au) as a material for second cathode layer 52.

Also, a metal layer including, for example, Pt, Ir, Ni, Pd, Au or laminate having a transparent conductive layer, such as ITO, and a reflective layer, such as Al, can be used as the anode 2.

Exemplary embodiments of the present invention will be described below.

An organic EL element having the configuration of FIG. 1 was prepared in the following manner, which is hereinafter referred to as Example 1.

Initially, square transparent glass substrate 1 having a thickness of 1.1 mm and a length in side of 150 mm was prepared, and this glass substrate 1 was cleaned. Next, using a sputtering apparatus, transparent IDIXO ($In_2O_3$—ZnO) film (anode) 2 was formed on glass substrate 1. A film-forming condition was, degree of vacuum: $1 \times 10^{-4}$ Pa or less, sputtering gas: a gaseous mixture of Ar and $O_2$ (flow rate ratio of Ar to $O_2$ was 10:1), voltage: 320 V, electric current: 0.15 mA, film-forming time: 14 minutes. By this, the thickness of IDIXO film (anode) 2 was set to 1000 angstroms. In this connection, an ITO ($In_2O_3$—$SnO_2$) film or the like may be formed as anode 2.

Subsequently, glass substrate 1 was subjected to oxygen plasma treatment. Using "VPS 020" manufactured by Sanyu Electron Co., Ltd. as a plasma system, purging with oxygen was performed twice or three times, and oxygen plasma treatment was conducted under the condition of voltage: 10 mA, treatment time: 5 minutes. By this procedure, the surface of IDIXO film (anode) 2 on glass substrate 1 was oxygen-plasma-treated.

All of the above steps were performed in a clean room. All of the following steps were carried out in a glove box. The inside of the glove box was in an atmosphere substantially free from oxygen and water (oxygen concentration: 0.01 ppm or less, dew-point of water: −70° C. or less).

Initially, Bayer's "Baytron P" (a mixture of polyethylene-dioxythiophene (PEDOT) and polystyrenesulfonic acid (PSS) was mixed with polystyrenesulfonic acid in a ratio of "Baytron P" to PSS of 5:1. The resulting mixture was further diluted 1.5 times with water.

PEDOT is a polymeric compound represented by the following chemical formula (1) and PSS is a polymeric compound represented by the following chemical formula (2).

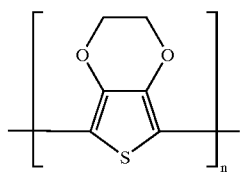

[Chemical Formula 1] (1)

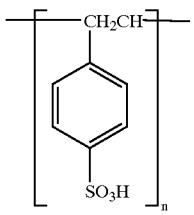

[Chemical Formula 2] (2)

This fluid was applied by spin coating process onto IDIXO film (anode) 2 in which the surface had been oxygen-plasma-treated. The application condition was as follows: rotation speed: 3000 rpm, and rotation time: 45 seconds. Glass substrate 1 in this state was heated at 200° C. for 10 minutes to thereby form hole injecting and transporting layer 3 having a thickness of 600 angstroms on IDIXO film (anode) 2.

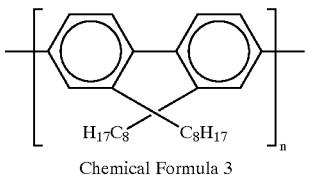

Chemical Formula 3 (3)

Next, a polyfluorene derivative represented by the following chemical formula (3) was dissolved in xylene solvent. This solution was applied onto hole injecting and transporting layer 3 by spin coating process to thereby form light emitting layer 4 having a thickness of 800 angstroms on hole injecting and transporting layer 3. In this connection, a layer including, for example, poly(para-phenylenevinylene) may be formed as light emitting layer 4.

Subsequently, a Ca thin film was formed as first cathode layer 51 on light emitting layer 4 by vacuum deposition process, and then an Al thin film was formed as second cathode layer 52 thereon. The film formation operations of both of the thin films were continuously performed using a vacuum deposition system arranged in a glove box. Initially, a Ca thin film having a thickness of 70 angstroms was formed in the condition that the initial degree of vacuum was about $1\times10^{-6}$ torr and the film-forming rate was 3 angstroms per second, and after the degree of vacuum returned to about $1\times10^{-6}$ torr, an Al thin film having a thickness of 10 angstroms was formed in the condition that the film-forming rate was 3 angstroms per second.

By this procedure, laminate 20 including anode 2, hole injecting and transporting layer 3, light emitting layer 4, and cathode 5 of two-layer structure was formed on glass substrate 1. Of individual layers constituting laminate 20, anode 2 is planar and its terminal part 2a extends beyond the other layers, and the other layers were formed such that their planar portions are of the same size in the same location.

Next, a LiF thin film having a thickness of 500 angstroms was formed as first sealing layer 6 on glass substrate 1 in this state. This film formation was performed in the condition that the film-forming rate was 8 angstroms per second, after the film formation of second cathode layer 52 and after the degree of vacuum returned to about $1\times10^{-6}$ torr. The film formation operations of first cathode layer 51, second cathode layer 52, and first sealing layer 6 were performed in the same vacuum deposition system without the opening of vacuum chamber.

By this procedure, first sealing layer 6 including LiF was formed on the entire top face (the surface on the opposite side to the substrate side) of cathode 5 of this laminate 20, over the entire end face of laminate 20 other than terminal part 2a, and over a portion of the top face of terminal part 2a.

Subsequently, glass substrate 1 taken out from the vacuum deposition system was cooled, and a thermosetting epoxy resin "DP pure 60" manufactured by Minnesota Mining & Manufacturing Co. was applied as second sealing layer 7 to the entire outer side of first sealing layer 6 by a dipping process. In this connection, second sealing layer 7 may be formed by using, for example, "STYCAST 1269A" manufactured by EMERSON & COMING CO.

Next, transparent glass plate 8 having a thickness of 0.3 mm was placed on the top face of the above-formed second sealing layer 7, and glass substrate 1 in this state was placed on a hot plate in a glove box and was heated at 50° C. in the vacuum of about 0.1 torr for 12 hours. By this procedure, the epoxy resin was cured while removing bubbles, to thereby form second sealing layer 7 including epoxy resin having a thickness of 200 μm on overall of the outer side of first sealing layer 8. Additionally, glass plate 8 that provides sealing was fixed on the top face of second sealing layer 7.

The organic EL element having the configuration of FIG. 1 was thus obtained.

As a second example, a LiF thin film having a thickness of 200 angstroms was formed as first sealing layer 6. Except for this aspect, an organic EL element was prepared in the very same manner as in Example 1.

As a third example, a LiF thin film having a thickness of 300 angstroms was formed as first sealing layer 6. Except this aspect, an organic EL element was prepared in the very same manner as in Example 1.

As a fourth example, a LiF thin film having a thickness of 400 angstroms was formed as first sealing layer 6. Except for this aspect, an organic EL element was prepared in the very same manner as in Example 1.

As a fifth example, a LiF thin film having a thickness of 500 angstroms was formed as first sealing layer 6. Except for this aspect, an organic EL element was prepared in the very same manner as in Example 1.

As a sixth example, a LiF thin film having a thickness of 600 angstroms was formed as first sealing layer 6. Except for this aspect, an organic EL element was prepared in the very same manner as in Example 1.

Each of the organic EL elements of Examples 1 to 6 was allowed to emit light at a drive voltage of 8 V, and the luminance of the light was determined on the glass plate 8 side (on the cathode 5 side). Separately, each of the organic EL elements was allowed to emit light at varying drive voltages, and the luminance of the light was determined on the glass plate 8 side (on the cathode 5 side), and the minimum of the drive voltage at which the luminance was 5 cd/m$^2$ or more was determined as "threshold voltage". A luminance meter "BM-7" manufactured by Topcon Corporation was used in the determination of luminance.

The luminance determination and the determination of threshold voltage were performed immediately after the preparation of the organic EL element (initial), and after the organic EL element was left in the condition at a temperature of 20° C. at humidity of 50% for one month. These results are shown in the following Table 1.

TABLE 1

| First Sealing Layer Thickness (Å) | Threshold Voltage (V) | | Luminance (cd/m$^2$) | |
|---|---|---|---|---|
| | Initial | After 1 month | Initial | After 1 month |
| 200 | 3.2 | 3.6 | 200 | 60 |
| 300 | 3.1 | 3.2 | 160 | 100 |
| 400 | 2.9 | 3.4 | 190 | 160 |
| 500 | 3.0 | 3.1 | 180 | 160 |
| 600 | 3.2 | 3.5 | 100 | 110 |

As is apparent from the above results, the thickness of first sealing layer 6 of 200 angstroms is not preferred, since the luminance decreases to half or less after one month, although the initial luminance is high. This change with time is probably because sufficient sealing action by first sealing layer 6 could not be obtained since first sealing layer 6 was thin, and oxidation of first cathode layer 51 including calcium or deterioration of light emitting layer 4 occurred.

In contrast, the thickness of first sealing layer 6 of at least 300 angstroms is preferred, since decreases in luminance due to one-month storage are small, and the luminance after one month is not less than 100 cd/m$^2$.

The thickness of first sealing layer 6 of 600 angstroms is not preferred, as the initial luminance is low. This is probably because it took a long time to form the film of first sealing layer 6, and layers under this were exposed to heat over a long time, and deterioration occurred particularly in light emitting layer 4.

As a seventh example, the film forming rate of first sealing layer 6 was set to 4 angstroms per second. Except for this point, an organic EL element was manufactured in the same manner as in Example 1.

As an eighth example, the film forming rate of first sealing layer 6 was set to 6 angstroms per second. Except this point, an organic EL element was manufactured in the same manner as in Example 1.

As a ninth example, the thin film forming rate of first sealing layer 6 was set to 8 angstroms per second. Except for this point, an organic EL element was manufactured in the same manner as in Example 1.

As a tenth example, the film forming rate of first sealing layer 6 was set to 10 angstroms per second. Except this point, an organic EL element was manufactured in the same manner as in Example 1.

As an eleventh example, the film forming rate of first sealing layer 6 was set to 15 angstroms per second. Except this point, an organic EL element was manufactured in the same manner as in Example 1.

Each of the organic EL elements of Examples 7 to 11 was allowed to emit light at a drive voltage of 8 V, and the luminance of the light was determined on the glass plate 8 side (on the cathode 5 side). Separately, each of the organic EL elements was allowed to emit light at varying drive voltages, and the luminance of the light was determined on the glass plate 8 side (on the cathode 5 side), and the minimum of the drive voltage at which the luminance was 5 cd/m$^2$ or more was determined as "threshold voltage". A luminance meter "BM-7" manufactured by Topcon Corporation was used in the determination of luminance.

The luminance determination and the determination of threshold voltage were performed immediately after the preparation of the organic EL element (initial). These results are shown in the following Table 2.

TABLE 2

| Film Forming Rate of First Sealing Layer (Å/sec.) | Initial Threshold Voltage (V) | Initial Luminance (cd/m$^2$) |
|---|---|---|
| 4 | 5.1 | 120 |
| 6 | 3.5 | 140 |
| 8 | 3.0 | 180 |
| 10 | 3.2 | 190 |
| 15 | 3.1 | 180 |

As is apparent from the above results, the film-forming rates of first sealing layer 6 of 4 angstroms per second and of 6 angstroms per second are not preferred, since the initial threshold voltages are high. This is probably because it took a long time to yield the same thickness due to low film-forming rate of first sealing layer 6, and light emitting layer 4 was deteriorated due to long term exposure to heat.

In contrast, the film-forming rate of first sealing layer 6 of not less than 8 angstroms per second is preferred since the threshold voltage is low. This is probably because deterioration of light emitting layer 4 was inhibited as it was exposed to heat for a short period of time in the film formation of first sealing layer 6.

Additionally, the transmittance of the organic EL element obtained in Example 1 was determined. This determination was performed using a spectroscope manufactured by Hitachi Ltd. with air as a base line, while placing a pin hole 3 mm in diameter in a condenser unit. The result is shown as a graph in FIG. 2. As apparent from this graph, the transmittance of the organic EL element was not less than 50% over nearly all of the visible light region.

In this connection, the transmittance of glass substrate 1 having a thickness of 1.1 mm is about 75%. This organic EL element is found to have a visible light transmittance of about 70% of the glass substrate 1.

These results show that the organic EL elements obtained in Examples 1 to 11 are organic EL elements in which light is radiated toward both electrode sides.

In particular, when the thickness of first sealing layer 6 is set to 300 angstroms or more and the film-forming rate of first sealing layer 6 is set to 8 angstroms or more per second, the organic EL element can be satisfactorily sealed even when light is radiated to both electrode sides in the organic EL element. As a result, the satisfactory characteristic that light emits at high luminance at high efficiency by only the application of a low voltage can be ensured over a long time, even when light is radiated toward both electrode sides in the organic EL element.

As described above, according to the organic EL element and manufacturing method thereof in accordance with the invention, by specifying the material of the first sealant, the organic EL element can be satisfactorily sealed and change in characteristics over time can be inhibited, even when light is radiated to both electrode sides in the organic EL element.

What is claimed is:

1. An organic EL element, comprising:
   a substrate;
   a laminate formed on said substrate, said laminate having a structure including a cathode, an anode, and a light emitting layer including an organic material and being sandwiched between said cathode and anode; and
   a sealant, at least a face of the laminate opposite to the substrate being sealed by the sealant, the sealant having a plural-layer structure including an inner first sealing layer and an outer second sealing layer, said first sealing layer including a halide of at least one of an alkali metal or an alkaline earth metal, and said second sealing layer including a resinous material that is moisture resistant,
   wherein said first sealing layer has a thickness of not less than 300 angstroms and not more than 600 angstroms.

2. The organic EL element according to claim 1, said halide being selected from a group consisting of lithium fluoride, calcium fluoride, sodium fluoride, sodium chloride, potassium chloride, potassium bromide and magnesium fluoride.

3. The organic EL element according to claim 1, said second sealing layer including an epoxy resin.

4. The organic EL element according to claim 1, the cathode being arranged in the laminate opposite to the substrate, and being formed with a material containing calcium (Ca).

5. The organic EL element according to claim 1, wherein both of said cathode and anode have transparency.

6. A method of manufacturing an organic EL element, comprising the steps of:
   forming a laminate on a substrate, said laminate having a structure including a cathode, an anode, and a light emitting layer, said light emitting layer including an organic material and being sandwiched between said cathode and anode;
   forming a first sealing layer at least on a face of the laminate opposite to the substrate in an atmosphere being substantially free from oxygen and water, said first sealing layer including a halide of an alkali metal or an alkaline earth metal in a thickness of not less than 300 angstroms and not more than 600 angstroms; and
   forming a second sealing layer on an outer side of the first sealing layer in an atmosphere being substantially free from oxygen and water, said second sealing layer including a resinous material that is moisture resistant.

7. A method of manufacturing an organic EL element according to claim 6, said halide being selected from a group consisting of lithium fluoride, calcium fluoride, sodium fluoride, sodium chloride, potassium chloride, potassium bromide and magnesium floride.

8. The method of manufacturing an organic EL element according to claim 6, further including forming a layer including an epoxy resin as the second sealing layer.

9. The method of manufacturing an organic EL element according to claim 6, further including forming a layer including a material containing calcium (Ca) as the cathode in the laminate opposite to the substrate.

10. The method of manufacturing an organic EL element according to claim 6, further including forming the first sealing layer including LiF by vacuum deposition such that a film-forming rate is not less than 8 angstroms per 1 second.

11. The method of manufacturing an organic EL element according to claim 6, wherein both of said cathode and anode have transparency.

* * * * *